United States Patent
Mizumoto et al.

(10) Patent No.: US 10,993,343 B2
(45) Date of Patent: Apr. 27, 2021

(54) SEALING STRUCTURE

(71) Applicant: KABUSHIKI KAISHA TOKAI RIKA DENKI SEISAKUSHO, Aichi (JP)

(72) Inventors: Jun Mizumoto, Aichi (JP); Hironori Aoki, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 224 days.

(21) Appl. No.: 16/131,697

(22) Filed: Sep. 14, 2018

(65) Prior Publication Data

US 2019/0090373 A1 Mar. 21, 2019

(30) Foreign Application Priority Data

Sep. 20, 2017 (JP) .............................. JP2017-180468

(51) Int. Cl.
*H01M 2/10* (2006.01)
*H05K 5/06* (2006.01)

(52) U.S. Cl.
CPC .......... *H05K 5/069* (2013.01); *H01M 2/1044* (2013.01); *H05K 5/061* (2013.01)

(58) Field of Classification Search
CPC ...... H05K 5/069; H05K 5/061; H01M 2/1044
See application file for complete search history.

(56) References Cited

U.S. PATENT DOCUMENTS

| | | | | |
|---|---|---|---|---|
| 3,945,193 | A | * 3/1976 | Yasuda | G04C 10/00 368/88 |
| 7,981,535 | B2 | 7/2011 | Scott et al. | |
| 2010/0055550 | A1* | 3/2010 | Scott | H01M 2/1044 429/100 |

FOREIGN PATENT DOCUMENTS

| | | |
|---|---|---|
| EP | 2 405 407 | 1/2012 |
| JP | 2000-048786 | 2/2000 |
| JP | 2005-143138 | 6/2005 |

* cited by examiner

*Primary Examiner* — Gilbert Y Lee
(74) *Attorney, Agent, or Firm* — Greenblum & Bernstein, P.L.C.

(57) ABSTRACT

In a sealing structure that seals a gap between a pressed wall and a pressing wall with a sealing member, the pressed wall and the pressing wall are coupled to each other in an orthogonal direction that is orthogonal to an opposing direction in which the pressed wall and the pressing wall are opposed toward each other so that the sealing member is kept in a state held between the pressed wall and the pressing wall. The sealing member includes a first inclined surface inclined relative to the orthogonal direction. The first inclined surface is pressed by the pressing wall in the orthogonal direction so that the sealing member is pressed at least in the opposing direction.

9 Claims, 6 Drawing Sheets

SEALING STRUCTURE

CROSS-REFERENCE TO RELATED APPLICATIONS

This application is based upon and claims the benefit of priority from prior Japanese Patent Application No. 2017-180468, filed on Sep. 20, 2017, the entire contents of which are incorporated herein by reference.

FIELD

The present invention relates to a sealing structure.

BACKGROUND

Japanese Laid-Open Patent Publication No. 2000-48786 describes a known portable device including a sealing structure.

The portable device includes a case that accommodates a battery and an electronic component such as a circuit board. The case includes a housing and a cover. The housing, which is tubular and has a closed end, accommodates the battery, the circuit board, and the like. The cover is fitted to an open end of the housing so as to cover the opening. The housing includes an accommodation compartment that accommodates the battery and is open toward the cover. The side wall of the housing includes an annular groove extending around the accommodation compartment in the surface facing the cover. The groove receives an O-ring that serves as a sealing member. In a state in which the housing and the cover are coupled together, the O-ring is kept compressed between the bottom portion of the groove and the surface of the cover facing the housing. This restricts the entrance of water from the boundary between the housing and the cover. The compression direction of the O-ring is the same as the coupling direction of the housing and the cover.

SUMMARY

In the portable device including the above sealing structure, the housing and the cover receive compression reaction acting in a direction extending away from the compressed O-ring. Thus, the case may gradually open over time and weaken the compression of the O-ring. This may deteriorate the sealing performance of the portable device. Accordingly, the compression direction of the O-ring may be set to differ from the coupling direction of the housing and the cover. Specifically, the compression direction of the O-ring may be orthogonal to the coupling direction of the housing and the cover. In this case, the surface of the cover facing the housing includes a ring-shaped projection that is fitted to the groove. This holds the O-ring in a state compressed between the ring-shaped projection and the groove. However, when coupling the housing and the cover together, the O-ring may be twisted between the projection and the groove thereby deteriorating the sealing performance of the sealing structure.

One object of the present invention is to provide a sealing structure that limits twisting of the sealing member.

A sealing structure that achieves the above object seals a gap between a pressed wall and a pressing wall with a sealing member. The pressed wall and the pressing wall are coupled to each other in an orthogonal direction that is orthogonal to an opposing direction in which the pressed wall and the pressing wall are opposed toward each other so that the sealing member is kept in a state held between the pressed wall and the pressing wall. The sealing member includes a first inclined surface that is inclined relative to the orthogonal direction. The first inclined surface is pressed by the pressing wall in the orthogonal direction so that the sealing member is pressed at least in the opposing direction.

With this structure, when coupling the pressed wall and the pressing wall, the pressing wall presses the first inclined surface in the orthogonal direction so that the sealing member does not twist and enter the gap between the pressed wall and the pressing wall. This limits twisting of the sealing member that would be caused by movement of the sealing member along the outer circumferential surface of the pressing wall. Further, the pressing wall presses the sealing member against the pressed wall. In this way, the sealing member is kept in a state compressed between the pressed wall and the pressing wall. This ensures the sealing performance that restricts the entrance of foreign matter such as water, dust, or sand from the boundary between the pressed wall and the pressing wall.

Preferably, in the sealing structure, the pressing wall includes a second inclined surface corresponding to the first inclined surface of the sealing member. In a state in which the pressing wall is coupled to the pressed wall, the pressing wall presses the first inclined surface through the second inclined surface.

With this structure, the pressing wall is in planar contact with the sealing member through the first inclined surface and the second inclined surface. Accordingly, even when the sealing member behaves so as to twist along the outer circumferential surface of the pressing wall, the second inclined surface of the pressing wall receives the twisting force and further limits twisting of the sealing member.

Preferably, in the sealing structure, the first inclined surface is inclined relative to the orthogonal direction at an angle that is set so that a pressing force of the pressing wall acting on the first inclined surface in the opposing direction is greater than a pressing force of the pressing wall acting on the first inclined surface in the orthogonal direction.

In the sealing structure, when coupling the pressed wall and the pressing wall, the pressing wall applies force in a direction orthogonal to the first inclined surface. The force acting on the first inclined surface is divided into force acting in the opposing direction and force acting in the orthogonal direction.

With this structure, the force acting in the direction orthogonal to the first inclined surface is increased in the opposing direction. This further improves the seal between the pressed wall and the pressing wall.

Preferably, in the sealing structure, a seat is arranged in the opposing direction to hold the sealing member with the pressing wall. In a state in which the sealing member is kept compressed between the pressing wall and the seat, the first inclined surface is inclined relative to the orthogonal direction at an angle that is set so that a compression reaction of the sealing member restricts displacement of the pressing wall in the orthogonal direction.

When the sealing member is kept in a state compressed between the pressing wall and the seat, the sealing member produces the compression reaction that pushes back the pressing wall in the orthogonal direction. The compression reaction pushes back the pressing wall and decreases the pressing force of the pressing wall acting on the sealing member in the opposing direction. This may weaken the seal between the pressing wall and the pressed wall.

In this respect, the first inclined surface is arranged so that the pressing wall is not pushed back by the compression reaction of the sealing member, that is, so that the sealing member is not displaced in the orthogonal direction. This limits decreases in the pressing force of the pressing wall acting on the sealing member in the opposing direction. Consequently, the seal between the pressed wall and the pressing wall is maintained.

Preferably, this structure further includes a housing, which includes the pressed wall, and a lid, which includes the pressing wall and is coupled to the housing. When the lid is coupled to the housing, the pressing wall opposes the pressed wall in a direction orthogonal to a coupling direction in which the lid and the housing are coupled.

Preferably, with this structure, the coupling direction is a direction in which the lid and the housing are opposed toward each other.

Preferably, with this structure, the housing includes a cylindrical receptacle having a closed end. The lid is coupled to the housing to cover the receptacle. The pressed wall of the housing is an inner circumferential wall that defines the receptacle. An axial direction of the inner circumferential wall coincides with the coupling direction of the housing and the lid. The lid includes a surface opposing the housing. The pressing wall is located on the surface of the lid opposing the housing and includes a looped projection that enters the receptacle. The sealing member is loop-shaped and held between the inner circumferential wall of the housing and the looped projection of the lid. The first inclined surface of the sealing member extends in a circumferential direction of the sealing member and is located at a radial inner side of the sealing member. In a state in which the lid is coupled to the housing, the projection entirely presses the first inclined surface.

Preferably, with this structure, when coupling the housing and the lid, the projection presses the first inclined surface at the looped portion of the sealing member along the entire circumference so that the sealing member does not move back toward the lid. This limits twisting of the sealing member that would be caused by movement of the sealing member along the outer circumferential surface of the projection.

With this structure, the seat projects from at least part of the inner circumferential wall of the housing.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

A portable device including one embodiment of a sealing structure will now be described.

Figure 1:
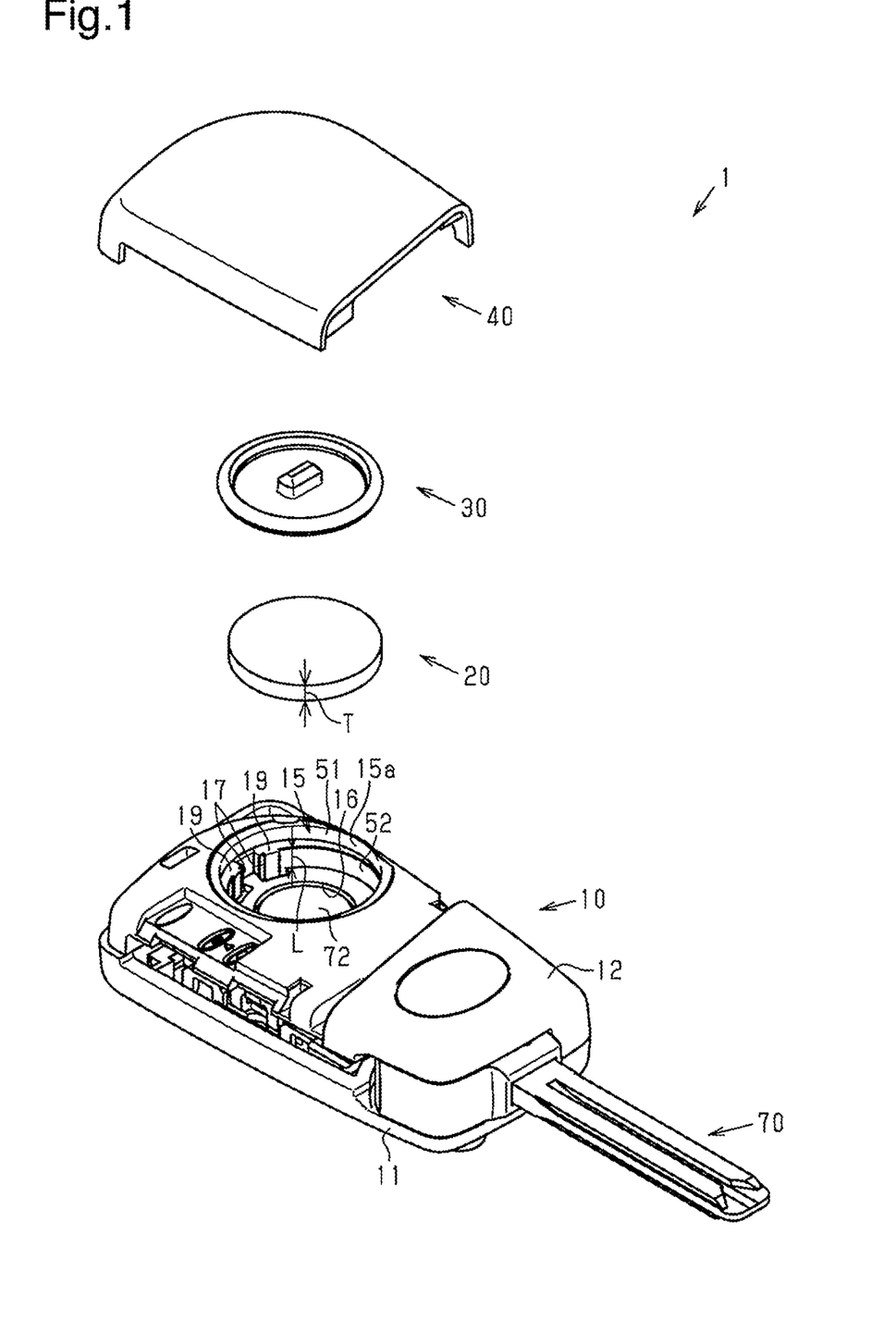
FIG. 1 is an exploded perspective view showing one embodiment of a portable device.

As shown in FIG. 1, a portable device 1 includes a housing 10, which serves as a housing body, a disc-shaped battery 20, a round sealing member 30, and a cover 40, which serves as a lid.

The housing 10 has the form of a rectangular box. The housing 10 includes an upper case 11, a lower case 12, and a mechanical key 70. The mechanical key 70 is supported in a state sandwiched by the upper case 11 and the lower case 12. The lower case 12 includes a surface that includes a receptacle 15, which is cylindrical and includes a bottom end as viewed in FIG. 1.

The lower case 12 includes an inner circumferential wall 15a that defines the receptacle 15. The inner circumferential wall 15a extends from the bottom end of the receptacle 15 in a coupling direction of the housing 10 and the cover 40. In other words, an axial direction of the receptacle 15 coincides with the coupling direction of the housing 10 and the cover 40. In the present embodiment, the coupling direction is the direction in which the housing 10 and the cover 40 are opposed toward each other. The inner circumferential wall 15a is an example of a pressed wall. The receptacle 15 in the lower case 12 opens toward the outside. The bottom end of the receptacle 15 includes a round through hole 16 that connects the receptacle 15 and the interior of the housing 10. For example, a board accommodation portion (not shown) is defined in the interior of the housing 10 to accommodate a control board (not shown). In this case, the board accommodation portion and the receptacle 15 are located at opposite sides of the through hole 16. The through hole 16 extends through the lower case 12 from the bottom end of the receptacle 15 to the board accommodation portion. The control board includes a disc-shaped first terminal 72 that is inserted into the through hole 16. Two arc-shaped seats 17 are arranged on the inner circumferential wall 15a of the lower case 12.

Figure 3:
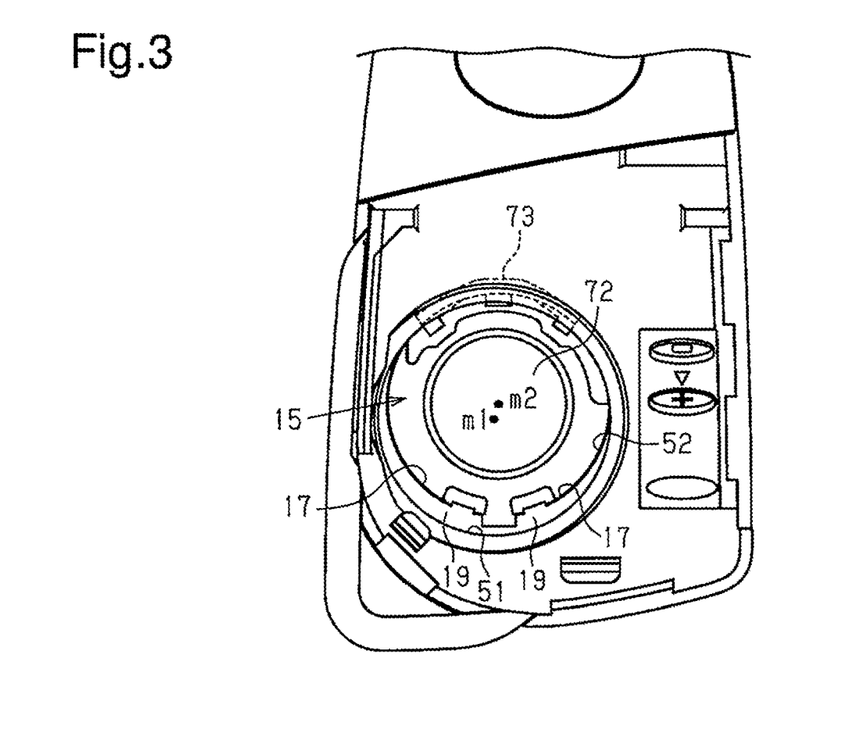
FIG. 3 is a plan view showing the receptacle in the portable device.

As shown in FIG. 3, the two seats 17 are arranged on the inner circumferential wall 15a of the lower case 12 to be substantially mirror-symmetric. Each seat 17 is projected from the inner circumferential wall 15a by an amount that gradually increases from a first circumferential end toward a second circumferential end, which is opposite to the first circumferential end in a circumferential direction of the inner circumferential wall 15a.

As shown in FIG. 1, each seat 17 includes an upper surface (upper surface as viewed in FIG. 1) that functions as a seat surface 19 on which part of a sealing member 30 is placed.

Figure 2:
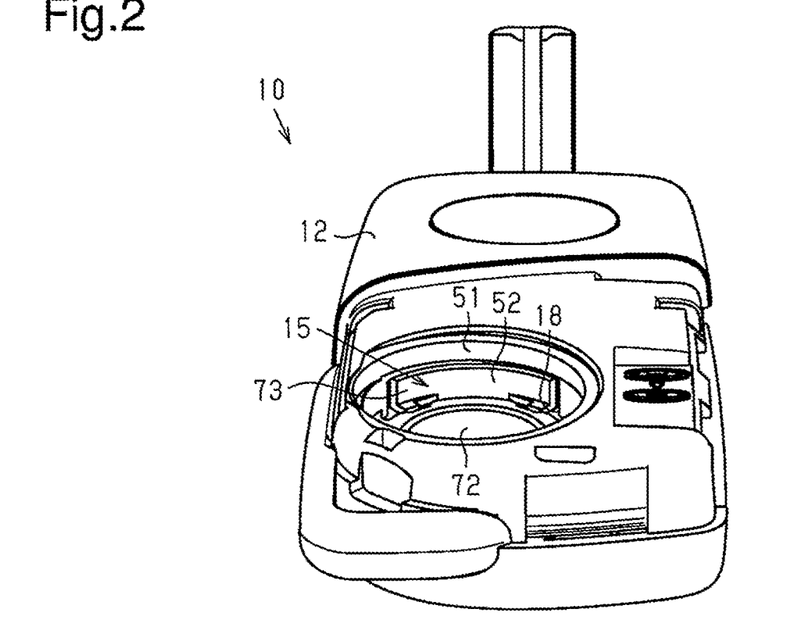
FIG. 2 is a perspective view showing the interior of a receptacle in the portable device.

As shown in FIG. 2, the inner circumferential wall 15a of the lower case 12 includes a slot 18 extending over a predetermined range. The slot 18 extends through the inner circumferential wall 15a of the lower case 12. A second terminal 73 projects from the control board so as to close the slot 18. The second terminal 73 is curved in a circumferential direction of the disc-shaped first terminal 72. The first terminal 72 is a negative terminal that contacts a rear side of the battery 20. The second terminal 73 is a positive terminal that contacts the circumferential surface of the battery 20.

Referring to FIG. 3, in the circumferential direction of the inner circumferential wall 15a of the lower case 12, each seat 17 includes a curved surface that extends along substantially the same circle as the curved surface of the second terminal 73. Further, the curved surface of each seat 17 and the curved surface of the second terminal 73 lie along a hypothetical circle that is concentric with the first terminal 72. The seat surfaces 19 of the two seats 17 divide the receptacle 15 into two receptacle portions, which have different axes. Specifically, the receptacle 15 is divided into a first receptacle portion 51 and a second receptacle portion 52. The axis of the first receptacle portion 51 will be referred to as axis m1, and the axis of the second receptacle portion 52 will be referred to as axis m2.

As shown in FIGS. 1 and 2, the first receptacle portion 51 is cylindrical and has a bottom end defined by the seat surfaces 19 of the two seats 17. The second receptacle portion 52 is in communication with the first receptacle portion 51 through the bottom end of the first receptacle portion 51. The second receptacle portion 52 is cylindrical and defined by the curved surfaces of the two seats 17, the curved surface of the second terminal 73, and the bottom end of the receptacle 15. The second receptacle portion 52 accommodates the battery 20. The inner diameter of the second receptacle portion 52 is slightly larger than the outer diameter of the battery 20. A length L of the second receptacle portion 52 from its bottom end (height of seats 17) is the same as a thickness T of the battery 20. In a state in which the battery 20 is accommodated in the second receptacle portion 52, the sealing member 30 is accommodated in the first receptacle portion 51. In such a state, the cover 40 is arranged on the housing 10 to cover the opening of the receptacle 15. The cover 40 is fixed to the housing 10 with a snap-fit structure (not shown).

The sealing structure of the portable device 1 will now be described in detail.

Figure 5:
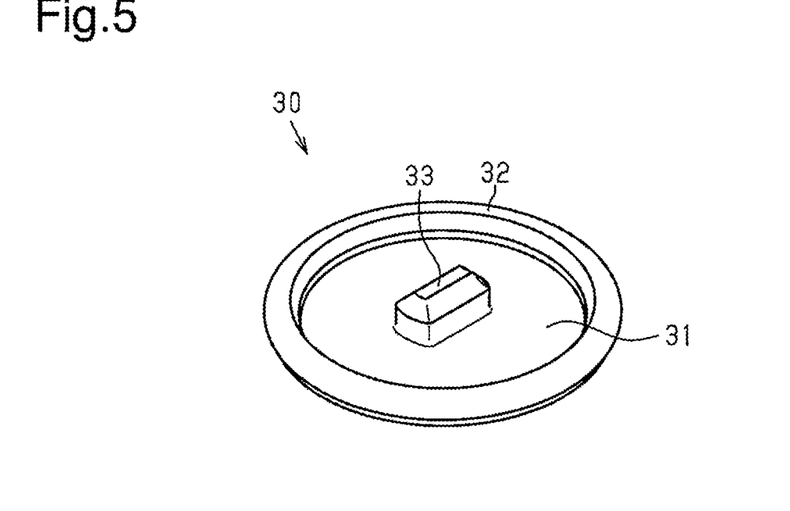
FIG. 5 is a perspective view of a sealing member of the portable device.

As shown in FIG. 5, the sealing member 30 includes a disc-shaped sealing plate 31, an annular sealing loop 32, which serves as a loop, and a tab 33. The tab 33 is located at the center of the sealing plate 31. The sealing loop 32 is integrated with the circumference of the sealing plate 31.

Figure 6:
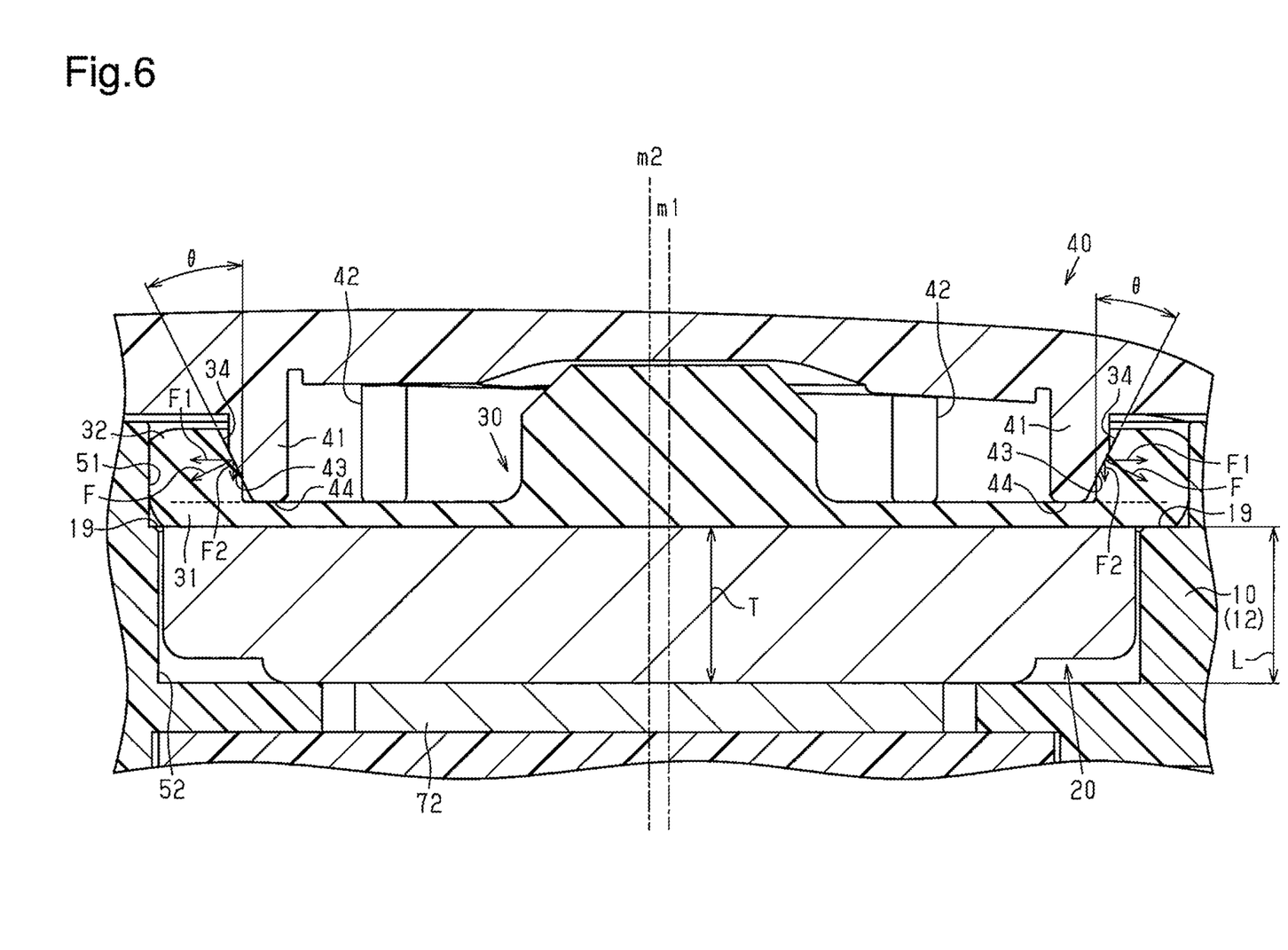
FIG. 6 is a cross-sectional view showing the interior of the receptacle in the portable device.

As shown in FIG. 6, the sealing loop 32 projects upward from the circumference of the sealing plate 31. The outer diameter of the sealing loop 32 is set to be larger than the diameter of the sealing plate 31 and slightly larger than the diameter of the first receptacle portion 51. The radially inner side of the sealing loop 32 includes an annular first inclined surface 34 that is inclined relative to the coupling direction of the housing 10 and the cover 40. The first inclined surface 34 is a conical surface of which the diameter gradually decreases from the cover 40 toward the housing 10 in the coupling direction of the housing 10 and the cover 40. In a state in which the sealing member 30 is accommodated in the first receptacle portion 51, the sealing plate 31 covers the second receptacle portion 52. The lower surface (surface opposite to side facing cover 40) of the sealing plate 31 contacts the upper surface of the battery 20 and the seat surfaces 19. Further, the axes of the sealing plate 31 and the sealing loop 32 coincide with axis m1 of the first receptacle portion 51. The upper surface of the battery 20 is an example of a seat for the sealing member 30.

Figure 4:
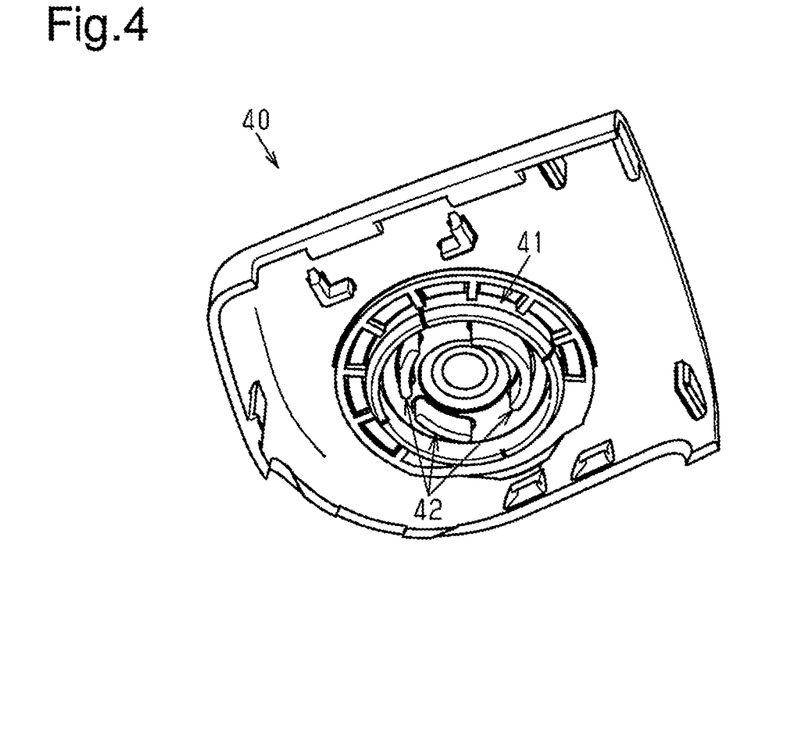
FIG. 4 is a perspective view showing the structure of a cover at the side facing a housing of the portable device.

As shown in FIG. 4, the cover 40 includes an inner surface 40a (surface facing lower case 12) from which a ring-shaped first projection 41, which serves as a pressing wall, and three second projections 42 project. The ring-shaped first projection 41 may be divided into segments. Further, the number of the second projections 42 may be changed. The first projection 41 and the second projections 42 are projected in the coupling direction of the housing 10 and the cover 40. Each second projection 42 is located at the inner side of the first projection 41 and has the form of an arc so that the second projections 42 extend along substantially the same circle.

As shown in FIG. 6, in a state in which the cover 40 is coupled to the housing 10, the second projections 42 form a hypothetical circle of which the axis coincides with axis m2 of the battery 20, the second receptacle portion 52, and the first terminal 72. Further, the three second projections 42 are located in the first receptacle portion 51. The three second projections 42 each include a distal end that presses the upper surface of the battery 20 through the sealing plate 31 of the sealing member 30. Accordingly, the three second projections 42 accurately position the battery 20 in the axial direction. Further, the projection amount of each second projection 42 from the cover 40 is set taking into consideration the dimensional tolerance allowed for the length L of the second receptacle portion 52. More specifically, when molding the lower case 12, the length L of each second receptacle portion 52 may be set to be slightly greater than the thickness T of the battery 20. In this case, when the battery 20 is accommodated in the second receptacle portion 52 and the sealing member 30 is accommodated in the first receptacle portion 51, a gap corresponding to the dimensional tolerance allowed for the second receptacle portion 52 may be formed between the upper surface of the battery 20 and the lower surface of the sealing plate 31 of the sealing member 30. However, the length of the second projections 42 in the present embodiment is set taking into consideration the dimensional tolerance allowed for the length L of the second receptacle portion 52. In this respect, each second projection 42 presses the battery 20 through the sealing plate 31 so that the battery 20 is accurately positioned in the axial direction.

In a state in which the cover 40 is coupled to the housing 10, the axis of the first projection 41 coincides with axis m1 of the sealing member 30 and the first receptacle portion 51. Further, the first projection 41 is located in the first receptacle portion 51. The outer circumference of the first projection 41 opposes the inner circumferential surface (wall 15a) of the first receptacle portion 51. The first projection 41 includes a distal end of which the outer circumference includes an annular second inclined surface 43. The second inclined surface 43 is a conical surface inclined by the same angle as the first inclined surface 34 relative to the coupling direction of the housing 10 and the cover 40. Further, the distal end of the first projection 41 includes a flat surface 44 that is orthogonal to the coupling direction of the housing 10 and the cover 40. The flat surface 44 intersects with the second inclined surface 43. The second inclined surface 43 of the first projection 41 presses the sealing loop 32 along its entire circumference through the first inclined surface 34. In this case, the first inclined surface 34 is in planar contact with the second inclined surface 43. Accordingly, the second inclined surface 43 of the first projection 41 presses the first inclined surface 34 in a vertical direction relative to the surface. The force pressing the first inclined surface 34 may be referred to as the pressing force F. In this case, the inclination of the first inclined surface 34 and the second inclined surface 43 divides the pressing force F into force F1 and force F2. Force F1 acts toward the inner circumferential wall 15a, which defines the first receptacle portion 51 (acts orthogonally to coupling direction of housing 10 and cover 40). Force F2 acts in the coupling direction of the housing 10 and the cover 40. Force F1 presses the sealing loop 32 against the inner circumferential wall 15a, which defines the first receptacle portion 51, and keeps the sealing loop 32 compressed between the second inclined surface 43 of the first projection 41 and the inner circumferential wall 15a. Further, the flat surface 44 of the first projection 41 contacts the upper surface of the sealing plate 31.

An inclination angle $\theta$ of the first inclined surface 34 and the second inclined surface 43 relative to the coupling direction of the housing 10 and the cover 40 is set so that force F1 is greater than force F2 and force F2 is minimal.

Force F2 is minimal when the first projection 41 is not pushed back toward the cover 40 in the coupling direction of the housing 10 and the cover 40 by the compression reaction of force F2 pressing on the sealing member 30. Further, force F2 is minimal when force F2 is just enough for the first projection 41 to press the first inclined surface 34 so that the sealing member 30 does not twist along the outer circumferential surface of the first projection 41.

In the present embodiment, the coupling direction of the housing 10 and the cover 40 is orthogonal to the direction in which the outer circumferential surface of the first projection 41 (pressing wall) and the inner circumferential wall 15a (pressed wall), which defines first receptacle portion 51, are opposed toward each other. In other words, the direction orthogonal to the coupling direction of the housing 10 and the cover 40 is the direction in which the outer circumferential surface of the first projection 41 (pressing wall) and the inner circumferential wall 15a (pressed wall), which defines first receptacle portion 51, are opposed toward each other.

The above embodiment has the advantages described below.

(1) When coupling the housing 10 and the cover 40, the first projection 41 presses the sealing member 30 with force F2 so that the sealing member 30 does not move back toward the cover 40 in the coupling direction of the housing 10 and the cover 40. This limits twisting of the sealing member 30 that would be caused by movement of the sealing member 30 along the outer circumferential surface of the first projection 41.

(2) Further, since twisting of the sealing member 30 is limited, the cover 40 is smoothly coupled to the housing 10. This improves the coupling efficiency of the housing 10 and the cover 40.

(3) The first projection 41 presses the sealing loop 32 against the inner circumferential wall 15a, which defines the first receptacle portion 51. Thus the sealing member 30 is kept compressed in a state pressed against the inner circumferential wall 15a. This ensures the sealing performance that restricts the entrance of foreign matter such as water, dust, or sand from the boundary between the housing 10 and the cover 40.

(4) The second inclined surface 43 of the first projection 41 and the first inclined surface 34 of the sealing loop 32 are in planar contact with each other. Accordingly, even when the sealing member 30 behaves so as to twist along the outer circumferential surface of the first projection 41, the second inclined surface 43 of the first projection 41 receives the force that acts to twist the sealing member 30. This further limits twisting of the sealing member 30.

(5) When the second inclined surface 43 of the first projection 41 presses the first inclined surface 34 of the sealing loop 32 in the coupling direction of the housing 10 and the cover 40, the upper surface of the sealing plate 31 contacts the flat surface 44 of the first projection 41. Thus, even when the sealing member 30 behaves so as to twist along the outer circumferential surface of the first projection 41, twisting of the sealing member 30 is further limited.

(6) In a state in which the housing 10 and the cover 40 are coupled, the battery 20 is in planar contact with the lower surface of the sealing plate 31. Accordingly, if the battery 20 acts to move in the coupling direction of the housing 10 and the cover 40, the sealing plate 31 limits movement of the battery 20 in the axial direction. This accurately positions the battery 20 in the axial direction.

(7) The pressing force F acting on the first inclined surface 34 of the sealing member 30 is divided into force F1 and force F2. Force F1 is set to be greater than force F2. Accordingly, the pressing force F, which acts on the first inclined surface 34, is increased in the direction orthogonal to the coupling direction of the housing 10 and the cover 40. This improves the seal between the first projection 41 and the first receptacle portion 51.

(8) When the distal end of the first projection 41 is a flat surface orthogonal to the coupling direction of the housing 10 and the cover 40 and the sealing loop 32 is compressed only in the coupling direction of the housing 10 and the cover 40, the cover 40 would receive a compression reaction that is equal to the pressing force F via the first projection 41 from the sealing loop 32.

In this respect, in the present embodiment, the compression reaction in the coupling direction that the cover 40 receives from the sealing loop 32 is equal to force F2, with which the first projection 41 presses the sealing loop 32 in the axial direction. The compression reaction is also smaller than the pressing force F because of the inclination of the first inclined surface 34. Further, in the present embodiment, the inclination angle 9 of the first inclined surface 34 and the second inclined surface 43 is set so that force F2 is minimal, that is, so that the first projection 41 is not pushed back and displaced toward the cover 40 in the coupling direction of the housing 10 and the cover 40 by the compression reaction of force F2, which presses the sealing member 30. This limits decreases in force F1, with which the first projection 41 presses the sealing member 30 in a direction orthogonal to the coupling direction of the housing 10 and the cover 40. Thus, the seal of the first projection 41 and the first receptacle portion 51 is maintained. Further, upward movement of the cover 40 relative to the housing 10 caused by the compression reaction of the sealing member 30 over time is limited. That is, wear does not cause the case to open.

The present invention is not limited to the above embodiment, and the elements in the embodiment may be combined or changed within the scope of the claims. Particularly, it should be understood that the present invention may be embodied in the following forms.

In the above embodiment, the distal end of the first projection 41 includes the flat surface 44. Instead, the flat surface 44 may be, for example, an arc-shaped surface projecting toward the sealing plate 31 of the sealing member 30. Further, the flat surface 44 does not necessarily have to contact the upper surface of the sealing plate 31 as long as the second inclined surface 43 presses the first inclined surface 34.

In the above embodiment, the sealing member 30 is circular, but may also be, for example, substantially square. In this case, the sealing plate 31 is square, and the sealing loop 32 has the form of a square loop. Further, structure of the housing 10 is changed in accordance with the shape of the sealing member 30. The sealing member 30 may have any shape as long as each of the sealing member 30, the inner circumferential wall 15a, which defines the first receptacle portion 51, and the first projection 41 of the cover 40 are arranged in corresponding positions. The tab 33 of the sealing member 30 may be omitted.

In the above embodiment, axis m1 of the first receptacle portion 51 and axis m2 of the second receptacle portion 52 do not coincide with each other but may coincide with each other.

Figure 7:
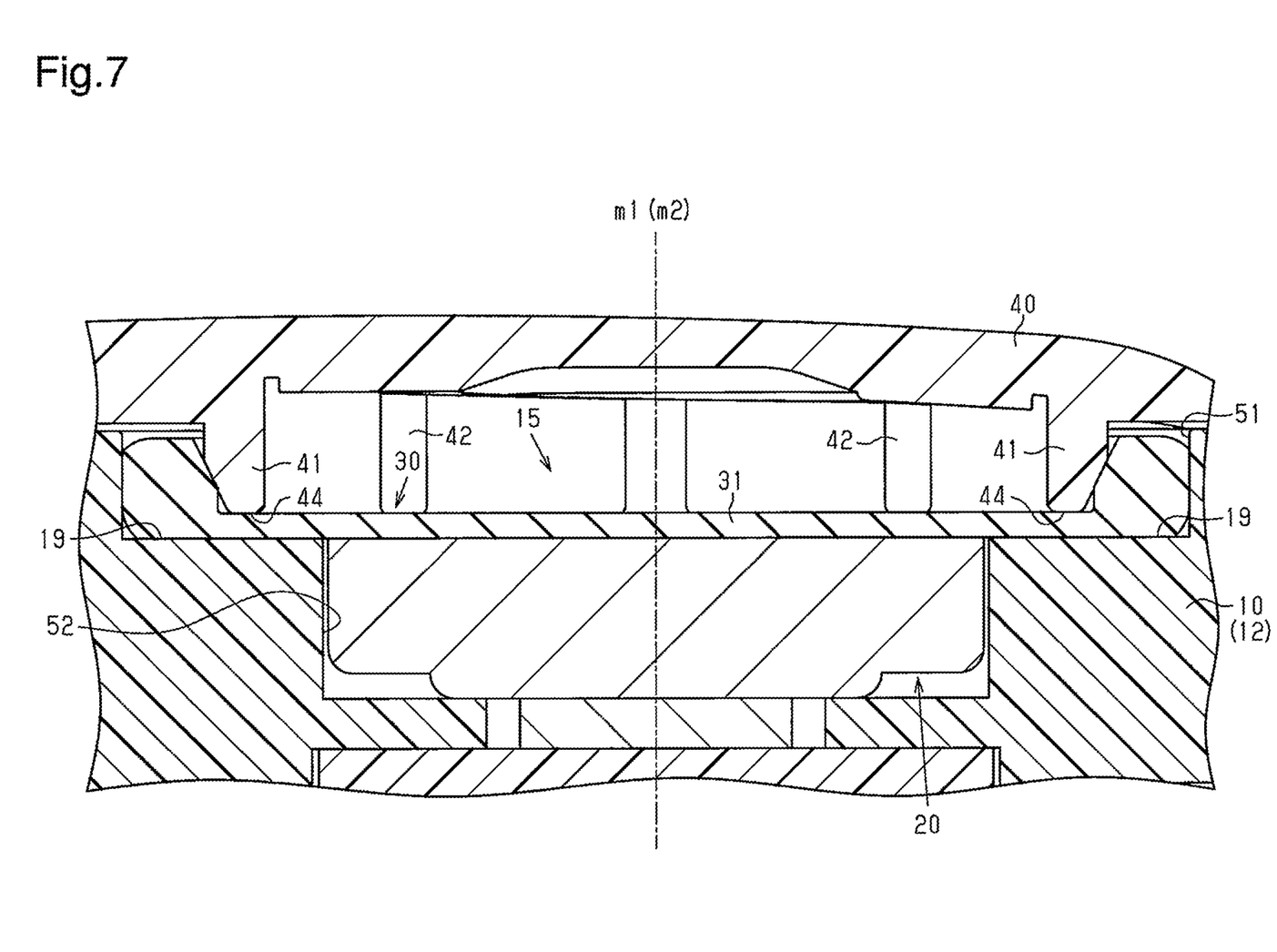
FIG. 7 is a cross-sectional view of another embodiment of the portable device.

As shown in FIG. 7, when axis m1 coincides with axis m2, the seat 17 (seat surface 19) may be arranged on the boundary between the first receptacle portion 51 and the second receptacle portion 52 in the coupling direction of the housing 10 and the cover 40 so that the seat 17 extends along the entire circumference of the receptacle 15. In this case, the axis of the first projection 41 may coincide with the axis of the hypothetical circle formed by the three second projections 42.

As shown in FIG. 7, the first projection 41 may be arranged in the coupling direction of the housing 10 and the cover 40 to oppose the seat surface 19 that extends along the entire circumference of the receptacle 15. Further, the sealing plate 31 of the sealing member 30 may be kept in a state compressed between the flat surface 44 of the first projection 41 and the seat surface 19. This further improves the seal between the housing 10 and the cover 40.

Figure 8:
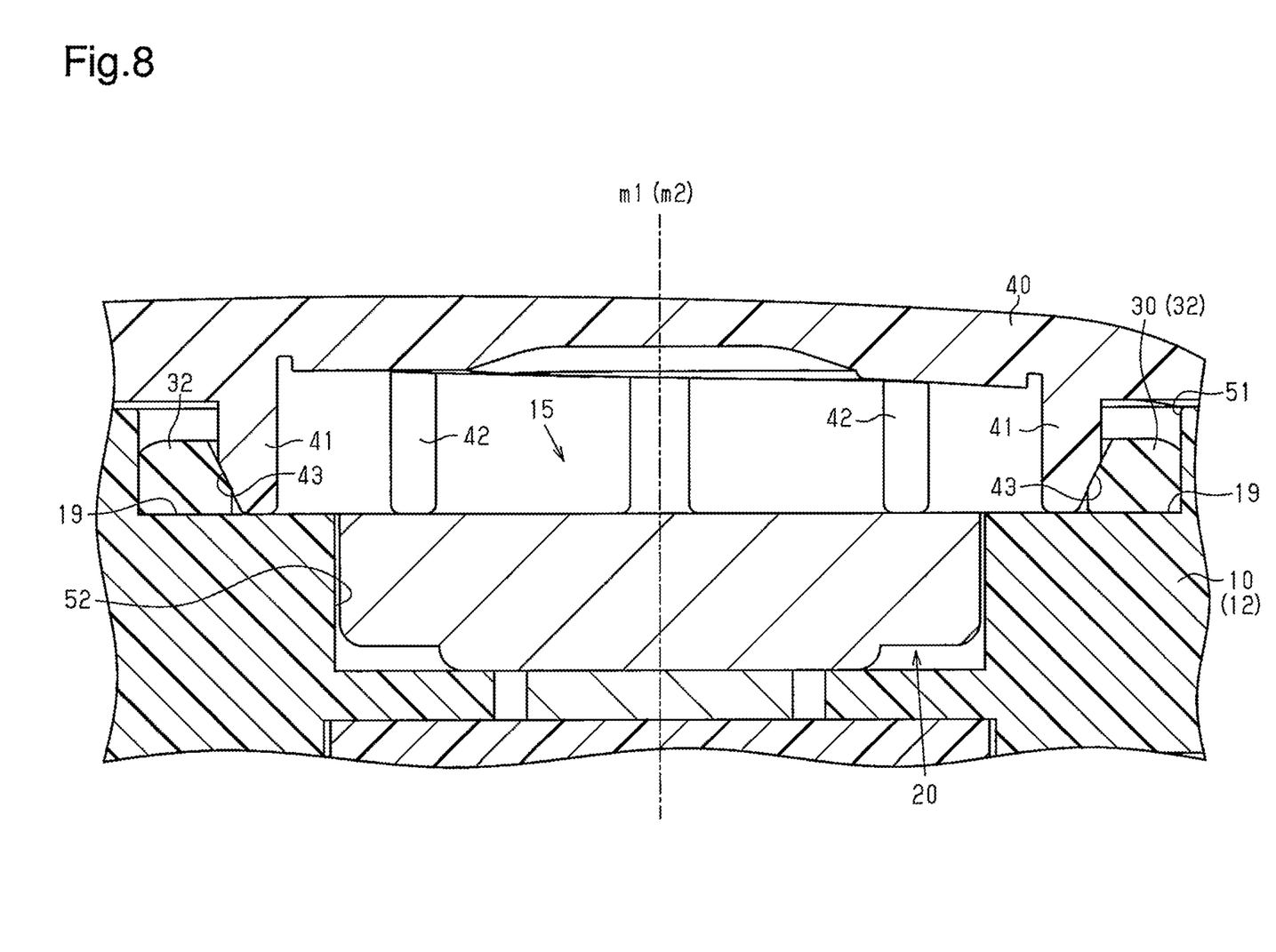
FIG. 8 is a cross-sectional view of a further embodiment of the portable device.

As shown in FIG. 8, the sealing plate 31 of the sealing member 30 may be omitted. In this case, the sealing loop 32 would be kept in a state compressed by the second inclined surface 43 of the first projection 41, the inner circumferential wall 15a, which defines the first receptacle portion 51, and the seat surface 19. This also maintains the seal of the housing 10 and the cover 40 and limits twisting of the sealing member 30. Additionally, the distal end of each second projection 42 may contact the upper surface of the battery 20 to limit movement of the battery 20 in the axial direction.

The application of the sealing structure of the above embodiment is not limited to the portable device 1. For example, the sealing structure may be applied to electronic devices that accommodate the battery 20 or other electronic components in the receptacle 15. In this case, when the sealing member 30 includes the sealing plate 31, the lower surface of the sealing plate 31 may contact an electronic component other than the battery 20 to accurately position the electronic component in the axial direction.

In the above embodiment, the second inclined surface 43 of the first projection 41 presses the first inclined surface 34 of the sealing member 30. Instead, the second inclined surface 43 may be an arc-shaped surface projecting outward in the radial direction from the first projection 41. Further, the second inclined surface 43 may be omitted and the outer circumferential surface of the first projection 41 may be a tubular surface. The first projection 41 may have any shape as long as the first projection 41 presses the first inclined surface 34.

In the above embodiment, the inclination angle θ of the first inclined surface 34 and the second inclined surface 43 relative to the coupling direction of the housing 10 and the cover 40 is set from the viewpoint that force F1 is larger than force F2 and force F2 is minimal. However, the inclination angle θ of the first inclined surface 34 and the second inclined surface 43 may be any angle as long as the sealing loop 32 is sufficiently pressed by force F1 through the first inclined surface 34 against the inner circumferential wall 15a, which defines the first receptacle portion 51, and the seal between the housing 10 and the cover 40 is sufficiently ensured. In this case, force F2 remains smaller than the pressing force F. Thus, opening of the case is obviated.

In the above modified examples, when the sealing structure of the present embodiment is applied to an electronic device other than the portable device 1, the first projection 41 does not necessarily have to press the first inclined surface 34 of the sealing member 30 along the entire circumference. For example, when product specifications do not require the entire circumference of the receptacle 15 to be sealed, the shape of the sealing member 30 may be changed accordingly. In such a case, the shape of the sealing member 30 may be changed in accordance with the specification of the electronic device, and the first inclined surface 34 of the first projection 41 is arranged at a location where the electronic device is required to be sealed. Even in this case, the first inclined surface 34 is pressed by a structure like the first projection 41, which is an example of a pressing wall.

In the above embodiment and the modified examples, the sealing member 30 does not necessarily have to be accommodated in the receptacle 15 (specifically, first receptacle portion 51). For example, the tubular housing, which has a closed end, may include a sealing member on the outer circumferential surface to ensure the seal of the housing and the cover. In this case, for example, the cover is also tubular, which has a closed end and includes an opening, to abut against the opening of the housing. More specifically, an annular seat is arranged on the outer circumferential surface of the housing, and the annular sealing member is placed on the seat. Since the seat is arranged on the outer circumferential surface of the housing, the side wall of the housing around the opening serves as a pressed wall. Accordingly, the seat intersects with the pressed wall. The outer circumferential surface of the sealing member includes a first inclined surface inclined relative to the coupling direction of the housing and the cover. The first inclined surface is a conical surface such that the outer diameter of the sealing member increases from the opening of the housing toward the seat. The annular side wall of the cover serves as a pressing wall. The inner circumferential surface at the distal end of the side wall of the cover includes a second inclined surface that corresponds to the first inclined surface of the sealing member. In a state in which the housing and the cover is coupled, the second inclined surface of the side wall of the cover presses the sealing member through the first inclined surface toward the side wall of the housing. Accordingly, the sealing member is kept in a state compressed between the side wall of the housing and the side wall of the cover. This also ensures the seal between the housing and the cover. Further, in the same manner as the above embodiment, twisting of the sealing member is limited.

In the present embodiment, the sealing member 30 is placed on the two seats 17 and the upper surface of the battery 20 (part of seat). In the modified examples, the sealing member 30 is placed on the seat 17 (seat surface 19) extending along the entire circumference of the receptacle 15 or on the seat arranged on the outer circumferential surface of the housing. However, when, for example, the sealing structure of the present embodiment is applied to an electronic device other than the portable device 1, the sealing member does not necessarily have to be placed on the seat as long as the sealing member is held between a portion serving as a pressed wall and a portion serving as a pressing wall and the portion serving as a pressing wall presses the first inclined surface of the sealing member in a direction in which the pressed wall and the pressing wall are opposed toward each other. This limits twisting of the sealing member that would be caused by movement of the sealing member on the outer circumferential surface of the portion serving as a pressing wall. Further, this ensures the seal between the pressing wall and the pressed wall.

The invention claimed is:

1. A sealing structure comprising:
a pressed wall;
a pressing wall that presses the pressed wall; and
a sealing member that includes a sealing plate and an annular sealing loop, wherein the annular sealing loop is integrated with the circumference of the sealing plate and seals a gap between the pressed wall and the pressing wall, wherein the pressed wall and the pressing wall are coupled to each other in an orthogonal direction that is orthogonal to an opposing direction in which the pressed wall and the pressing wall are opposed toward each other so that the annular sealing loop is kept in a state held between the pressed wall and the pressing wall, wherein the annular sealing loop includes a first inclined surface that is inclined relative to the orthogonal direction, the first inclined surface is pressed by the pressing wall in an orthogonal direction to the first inclined surface to press the annular sealing loop in at least the opposing direction, and a distal end of the pressing wall contacts an upper surface of the sealing plate.

2. The sealing structure according to claim 1, wherein
the pressing wall includes a second inclined surface that corresponds to the first inclined surface of the annular sealing loop, and in a state in which the pressing wall is coupled to the pressed wall, the pressing wall presses the first inclined surface with the second inclined surface.

3. The sealing structure according to claim 1, wherein the first inclined surface is inclined relative to the orthogonal direction at an angle that is set so that a pressing force of the pressing wall acting on the first inclined surface in the opposing direction is greater than a pressing force of the pressing wall acting on the first inclined surface in the orthogonal direction.

4. The sealing structure according to claim 1, further comprising a seat arranged in the opposing direction to hold the annular sealing loop with the pressing wall, wherein
the annular sealing loop is compressed between the pressing wall and the seat, and the first inclined surface is inclined relative to the orthogonal direction at an angle that is set so that a compression reaction of the annular sealing loop restricts displacement of the pressing wall in the orthogonal direction.

5. The sealing structure according to claim 1, further comprising:
a housing that includes the pressed wall; and
a lid that includes the pressing wall and is coupled to the housing,
wherein when the lid is coupled to the housing, the pressing wall opposes the pressed wall in a direction orthogonal to a coupling direction in which the lid and the housing are coupled.

6. The sealing structure according to claim 5, wherein the coupling direction is a direction in which the lid and the housing are opposed toward each other.

7. The sealing structure according to claim 5, wherein:
the housing includes a cylindrical receptacle having a closed end;
the lid is coupled to the housing to cover the receptacle;
the pressed wall of the housing is an inner circumferential wall that defines the receptacle; and
an axial direction of the inner circumferential wall coincides with the coupling direction of the housing and the lid.

8. The sealing structure according to claim 7, wherein:
the lid includes a surface opposing the housing;
the pressing wall is located on the surface of the lid opposing the housing and includes a looped projection that enters the receptacle;
the annular sealing loop is loop-shaped and held between the inner circumferential wall of the housing and the looped projection of the lid;
the first inclined surface of the annular sealing loop extends in a circumferential direction of the annular sealing loop and is located at a radial inner side of the annular sealing loop; and
in a state in which the lid is coupled to the housing, the projection entirely presses the first inclined surface.

9. The sealing structure according to claim 8, wherein the seat projects from at least part of the inner circumferential wall of the housing.

* * * * *